(12) United States Patent
Workman et al.

(10) Patent No.: US 9,646,268 B1
(45) Date of Patent: May 9, 2017

(54) SYSTEMS AND METHODS OF SUPPORTING A PRODUCT LIFE CYCLE MANAGEMENT (PLM) IMPLEMENTATION

(75) Inventors: Nat Workman, Oshkosh, WI (US); Carl Wendtland, Fond du Lac, WI (US); Saurabh Mishra, Jersey City, NJ (US)

(73) Assignee: Brunswick Corporation, Lake Forest, IL (US)

( * ) Notice: Subject to any disclaimer, the term of this patent is extended or adjusted under 35 U.S.C. 154(b) by 885 days.

(21) Appl. No.: 13/162,008

(22) Filed: Jun. 16, 2011

(51) Int. Cl.
*G06F 17/50* (2006.01)
*G06Q 10/06* (2012.01)

(52) U.S. Cl.
CPC ............ *G06Q 10/06* (2013.01); *G06F 17/50* (2013.01)

(58) Field of Classification Search
USPC ...................... 700/96–99, 104–107; 705/7.11
See application file for complete search history.

(56) References Cited

U.S. PATENT DOCUMENTS

| | | | | |
|---|---|---|---|---|
| 6,088,694 | A * | 7/2000 | Burns ................. | G06F 11/1451 707/999.01 |
| 6,496,957 | B1 * | 12/2002 | Kumagai ..................... | 716/112 |
| 6,811,344 | B1 * | 11/2004 | Kobayashi et al. .............. | 403/2 |
| 6,823,342 | B2 * | 11/2004 | Wallen et al. | |
| 6,959,268 | B1 * | 10/2005 | Myers, Jr. et al. ........... | 700/117 |
| 7,010,544 | B2 * | 3/2006 | Wallen et al. ................ | 707/791 |
| 7,058,587 | B1 * | 6/2006 | Horne .......................... | 705/7.22 |
| 7,103,434 | B2 * | 9/2006 | Chernyak et al. .............. | 700/98 |
| 7,143,100 | B2 * | 11/2006 | Carlson ................. | G06F 3/0481 707/999.104 |
| 7,200,454 | B2 * | 4/2007 | Coppola et al. .............. | 700/105 |
| 7,292,965 | B1 * | 11/2007 | Mehta et al. ..................... | 703/2 |
| 7,315,826 | B1 * | 1/2008 | Guheen et al. .............. | 705/7.29 |

(Continued)

OTHER PUBLICATIONS

James, L., "Cover Story: Mercury Marine", Oct. 2011, Retrieved from the Internet on Sep. 18, 2013 at "www.onwindows.com".*

(Continued)

*Primary Examiner* — Mohammad Ali
*Assistant Examiner* — Kelvin Booker
(74) *Attorney, Agent, or Firm* — Andrus Intellectual Property Law, LLP

(57) ABSTRACT

The systems and methods of the present application include a parts planning application (PPA) configured such that a bill of material (BOM) structure is automatically managed from a product data management (PDM) application, while supporting multiple product assemblies within a same project space and operating from a common code base. The PPA of the present application includes cross-functional attribute participation and is editable by all users simultaneously worldwide, thus eliminating the need for a dedicated project data administrator. The PPA of the present application enables daily or weekly management reviews, and attributes security managed by the functional group. The PPA of the present application fosters reduced data entry due to automated population of design structure and attributes from an existing PDM application and/or an enterprise resource planning (ERP) application. An audit trail function records and displays BOM and user-data entry changes, and utilizes a web-based application with spreadsheet-style or tabbed-style interface for ease of use.

24 Claims, 17 Drawing Sheets

(56) References Cited

U.S. PATENT DOCUMENTS

| | | | | |
|---|---|---|---|---|
| 7,340,383 | B2* | 3/2008 | Mayuzumi | G06Q 40/08 715/853 |
| 7,447,647 | B1* | 11/2008 | Shedlack | 705/26.8 |
| 7,702,636 | B1* | 4/2010 | Sholtis et al. | 707/999.1 |
| 7,774,225 | B2* | 8/2010 | Cargille et al. | 705/7.25 |
| 7,870,012 | B2* | 1/2011 | Katz et al. | 705/7.26 |
| 7,890,452 | B2* | 2/2011 | Moore | G06Q 10/10 707/608 |
| 8,121,874 | B1* | 2/2012 | Guheen et al. | 705/7.11 |
| 8,126,722 | B2* | 2/2012 | Robb et al. | 705/1.1 |
| 8,489,872 | B1* | 7/2013 | Kapoor | 713/100 |
| 8,781,882 | B1* | 7/2014 | Arboletti | G06Q 10/0639 705/7.11 |
| 2002/0138316 | A1* | 9/2002 | Katz et al. | 705/7 |
| 2002/0156757 | A1* | 10/2002 | Brown | 707/1 |
| 2002/0165805 | A1* | 11/2002 | Varga | G06Q 30/06 705/28 |
| 2002/0174000 | A1* | 11/2002 | Katz et al. | 705/7 |
| 2002/0178077 | A1* | 11/2002 | Katz et al. | 705/26 |
| 2002/0188622 | A1* | 12/2002 | Wallen | G05B 19/4097 707/999.104 |
| 2003/0007000 | A1* | 1/2003 | Carlson | G06F 3/0481 715/713 |
| 2003/0033179 | A1* | 2/2003 | Katz et al. | 705/7 |
| 2003/0050817 | A1* | 3/2003 | Cargille et al. | 705/8 |
| 2003/0050826 | A1* | 3/2003 | Cargille et al. | 705/10 |
| 2003/0120502 | A1* | 6/2003 | Robb et al. | 705/1 |
| 2003/0149578 | A1* | 8/2003 | Wong | 705/1 |
| 2004/0186765 | A1* | 9/2004 | Kataoka | G06Q 10/06 705/7.29 |
| 2004/0267396 | A1* | 12/2004 | Coppola et al. | 700/105 |
| 2005/0038821 | A1* | 2/2005 | Wallen et al. | 707/104.1 |
| 2005/0120010 | A1* | 6/2005 | Philpott et al. | 707/3 |
| 2005/0120032 | A1* | 6/2005 | Liebich et al. | 707/100 |
| 2005/0216429 | A1* | 9/2005 | Hertz et al. | 707/1 |
| 2008/0040179 | A1* | 2/2008 | Masermann et al. | 705/8 |
| 2008/0319812 | A1* | 12/2008 | Sousa et al. | 705/7 |
| 2009/0276338 | A1* | 11/2009 | Masermann et al. | 705/28 |
| 2009/0299513 | A1* | 12/2009 | Suh et al. | 700/107 |
| 2009/0312860 | A1* | 12/2009 | Beucker | G06Q 10/10 700/107 |
| 2009/0319677 | A1* | 12/2009 | Masermann et al. | 709/229 |
| 2010/0306339 | A1* | 12/2010 | Ling et al. | 709/213 |
| 2011/0112886 | A1* | 5/2011 | Rizzolo et al. | 705/7.28 |
| 2012/0041851 | A1* | 2/2012 | Tan | 705/30 |
| 2012/0069131 | A1* | 3/2012 | Abelow | 348/14.01 |
| 2012/0109350 | A1* | 5/2012 | Buchowski et al. | 700/98 |
| 2012/0109592 | A1* | 5/2012 | Potter et al. | 703/1 |
| 2012/0124204 | A1* | 5/2012 | Robb et al. | 709/224 |
| 2012/0303715 | A1 | 11/2012 | Han et al. | |
| 2013/0174136 | A1* | 7/2013 | Atkin et al. | 717/168 |
| 2013/0303715 | A1* | 11/2013 | Brothers et al. | 526/255 |

OTHER PUBLICATIONS

Workman, N., "Siemens PLM Community—The No. One Source for Siemens PLM Software Coverage", May 11, 2011, Mercury PLM Services.*
Workman, N., "Mercury PLM Services—Efficient Integration of People, Processes and Systems", Sep. 28, 2010.*
Mercury PLM Services marketing handout, 2011.
Mercury PLM Services Product Data Planning handout, 2011.
Mercury PLM Services Parts Planning slides, Oct. 13, 2010.
Mercury PLM Services Parts Planning application, 2011.
Parts Planning Slides (Oct. 13, 2010); Mercury PLM Services (hereinafter "Parts Planning").
John Bayless (2011), PLM Benefits for Program Management.
Table of Contents, CFLHD CADD Standards Manual, Chapter 4 (May 2, 2012).
From Our Experience, Mercury PLM: The Great Debate (2010), Mercury Marine.
From Our Experience, Mercury PLM Services: Guidance for managing product change (2011), Mercury Marine.
From Our Experience, Mercury PLM: Why business process ownership is critical to PLM success (2010), Mercury Marine.

* cited by examiner

| ItemId_EffectedItem | ItemId_TopLevel | AttributeName | OldValue | NewValue | Modified | Modified By |
|---|---|---|---|---|---|---|
| 8M0028766 | 8M0032234 | AgreedDrawingReleaseforPV1 | 4/30/2010 12:00:00 AM | 06/01/2010 | 4/29/2010 4:26 PM | Ryan Bonde |
| 8M0028766 | 8M0032234 | AgreedDrawingReleaseforDV2 | 4/30/2010 12:00:00 AM | 06/01/2010 | 4/29/2010 4:26 PM | Ryan Bonde |
| 8M0028766 | 8M0032234 | AgreedDrawingReleaseforDV2 | 4/30/2010 12:00:00 AM | 06/01/2010 | 4/29/2010 4:26 PM | Ryan Bonde |
| 8M0032026 | 8M0026675 | AgreedDrawingReleaseforPV1 | 4/30/2010 12:00:00 AM | 06/01/2010 | 4/29/2010 4:24 PM | Ryan Bonde |
| 8M0032026 | 8M0026675 | AgreedDrawingReleaseforPV1 | 4/30/2010 12:00:00 AM | 06/01/2010 | 4/29/2010 4:24 PM | Ryan Bonde |
| 8M0038428 | 8M0026675 | AgreedDrawingReleaseforPV1 | 4/30/2010 12:00:00 AM | 05/28/2010 | 4/29/2010 4:23 PM | Ryan Bonde |
| 8M0038428 | 8M0026675 | AgreedDrawingReleaseforDV2 | 4/30/2010 12:00:00 AM | 05/28/2010 | 4/29/2010 4:23 PM | Ryan Bonde |
| 8M0477799 | 8M0026675 | PrimaryPathSupplier | RB Royal | Xiyuan | 4/29/2010 7:50 AM | Kris Bosio |
| 8M0045954 | 8M0026675 | PartPlank | | C | 4/28/2010 4:22 PM | Kris Bosio |
| 8M0045964 | 8M0026675 | NewCurrentPart | | New | 4/28/2010 4:33 PM | Kris Bosio |

PPA
- PPA Data Entry
- Cost Weight Rollup
- Unique List of Items

PPA Overview
PPA Training
Documentation
Recycle Bin

Recent Attribute Changes...

Recent Product Structure Changes...

FIG. 10

| Review Attributes | Part Replacement | | ※Remove Filers | ②Refresh Data | ※Export to Excel | Enable Tree View | Manage Views ▼ | Source Legend ▼ | | |
|---|---|---|---|---|---|---|---|---|---|---|
| Default View | | | | | | | | | | |
| Status/Seq Nbr | Level | Item ID | Item Refs | Item Name | Design Lead Accountable | Commodity Manager | Buyer | Quality Engineer | New/Current Part | Part Rank | Source |
| 1 | 1 | 8M0026675 | 15 | 150-45 TOP LEVEL MERC XL | shalley | NR | NR | NR | New | | RE-Reference |
| 2 | 2 | 8M0026676 | 06 | BASE ENGINE | doelter | NR | NR | NR | New | | RE-Reference |
| 3 | 3 | 8M0026683 | 09 | SHORT BLOCK STRUCTURE | glangenf | NR | NR | NR | New | | RE-Reference |
| 4 | 4 | 8M0036564 | 02 | CYLINDER BLOCK ASM MACH | glangenf | NR | NR | tdwyer | New | A | M-Make |
| 5 | 5 | 8M0036563 | 02 | CYLINDER BLOCK MACHININ | glangenf | NR | NR | tdwyer | New | A | M-Make |
| 6 | 6 | 8M0036562 | 04 | CYLINDER BLOCK CASTING | glangenf | NR | NR | tdwyer | New | A | M-Make |
| 7 | 7 | 8M0031907 | 08 | CYLINDER LINER | glangenf | bkluge | ckonym | dkjek | New | B | P-Purchase |
| 8 | 7 | 825010 | A | PIN-DOWEL-99530-08012 | glangenf | rdtokes | wchapin | tkacamar | New | C | P-Purchase |
| 9 | 5 | 8M0036615 | 02 | BEDPLATE | mkollock | NR | NR | tdwyer | New | B | M-Make |
| 10 | 5 | 8M0045843 | 01 | M10HEX FLANGE HD SCREW | glangenf | rdtokes | wchapin | tkacamar | New | C | P-Purchase |
| 11 | 4 | 4010750 | B | SCREW-M8 X 50 HEX FLANGE | sanderno | rdtokes | ckonym | dkjek | Current | CP | P-Purchase |
| 12 | 4 | 892864A06 | B | THERMOSTAT ASY | sanderno | bkluge | ckonym | dkjek | Current | CP | P-Purchase |
| 13 | 5 | 8M0005358 | A | O RING-2 234X 139 | glangenf | landerso | cthuerw | molvaa | Current | | RE-Reference |
| 14 | 4 | 8M0033361 | 05 | COVER CRANKCASE | glangenf | landerso | cthuerw | molvaa | New | A | P-Purchase |
| 15 | 4 | 8M0007316 | 02 | CRANKCASE COVER PERIMETE | glangenf | landerso | cthuerw | molvaa | New | | RE-Reference |
| 16 | 4 | 8M0042861 | 01 | 8M0042861 DIPSTICK ASSEMB | glangenf | landerso | cthuerw | molvaa | New | | P-Purchase |
| 17 | 5 | 8M0242860 | 01 | DIPSTICK | glangenf | rdtokes | cthuerw | molvaa | New | C | RE-Reference |
| 18 | 5 | 48171 | B | O-RING 364 X 070 | glangenf | rdtokes | fwelland | tkacamar | Current | | P-Purchase |
| 19 | 4 | 8M0066347 | 01 | Plug | glangenf | rdtokes | fwelland | tkacamar | New | C | RE-Reference |
| 20 | 4 | 896351 | A | PLUG-24MM (CP) | mkollock | rdtokes | fwelland | tkacamar | Current | | P-Purchase |
| 21 | 5 | 19-8969510UP | A | 19-8963510UP | mkollock | rdtokes | fwelland | tkacamar | Current | | RE-Reference |
| 22 | 4 | 8M0035790 | 02 | 30MM ZERO-LEAK PLUG | mkollock | rdtokes | fwelland | tkacamar | New | C | P-Purchase |

| Status | Seq Nbr | Level | Item ID | Item Refs | Item Name | Design Lead Accountable | Commodity Manager | Buyer | Quality Engineer |
|---|---|---|---|---|---|---|---|---|---|
| | 1 | 1 | 8M0026675 | 15 | ISO-4S TOP LEVEL MEAG XL | shaley | NR | NR | NR |
| | 2 | 2 | 8M0026676 | 06 | BASE ENGINE | doelter | NR | NR | NR |
| | 3 | 3 | 8M0026683 | 09 | SHORT BLOCK STRUCTURE | glangenf | NR | NR | NR |
| | 26 | 3 | 8M0026684 | 08 | CYLINDER HEAD SYSTEM | mkollock | NR | NR | NR |
| | 66 | 3 | 8M0026686 | 07 | VALVE TRAIN DRIVE | | NR | NR | NR |
| | 76 | 3 | 8M0026687 | 05 | LUBRICATION DELIVERY | sandero | NR | NR | NR |
| | 77 | 4 | 8M0045862 | 01 | CAMSHAFT COVER ASSEMBLY | sandero | landerno | cthuerwa | mohran |
| | 84 | 4 | 88553525 | 8 | SCR-M5X25 HEX FLANGE HD/VMI | sandero | rotoken | mchapin | skacman |
| | 85 | 4 | 8M0041011 | 01 | OIL PUMP ASSEMBLY | sandero | bkluge | ckonyn | dojek |
| !NEW | 85 | 5 | 8M0045945 | 01 | BASE OIL PUMP | sandero | bkluge | ckonyn | dojek |
| | 87 | 5 | 8M0045947 | 01 | GEROTOR SET | sandero | bkluge | ckonyn | dojek |
| !NEW | 90 | 5 | 8M0045944 | 01 | COVER OIL PUMP | sandero | bkluge | ckonyn | dojek |
| | 91 | 5 | 896067 | - | PIN-DOWEL | sandero | bkluge | ckonyn | dojek |
| | 92 | 5 | 892838015 | 01 | SCREW M6X15 FLT HD | sandero | bkluge | ckonyn | dojek |
| !NEW | 93 | 5 | 8M0045954 | 01 | OIL SEAL | sandero | bkluge | ckonyn | dojek |
| !NEW | 95 | 5 | 8M0045951 | 01 | WATER SEAL | sandero | bkluge | ckonyn | dojek |
| | 99 | 5 | 8M0045948 | 01 | PRV PISTON | sandero | bkluge | ckonyn | dojek |
| | 100 | 5 | 8M0045949 | 01 | PRV RETAINER | sandero | bkluge | ckonyn | dojek |
| | 101 | 5 | 8M0045950 | 01 | PRV SPRING | sandero | bkluge | ckonyn | dojek |
| | 102 | 5 | 896066 | - | PIN-SPRING | sandero | bkluge | ckonyn | dojek |

Unique List of Items — 350

| Item ID | Revision | ItemName | New/Current Part | New Supplier to Mercury | 8M00266675 | 8M00322234 | 8M00322240 |
|---|---|---|---|---|---|---|---|
| 62652 | B | TERMINAL RING 5/16 | Current | N | 6 | 6 | 6 |
| 88552525 | B | SCR-M6X25 HEX FLANGE | Current | N | 36 | 36 | 3 |
| 889634 | A | WIRE-SEAL | Current | N | 15 | 15 | 14 |
| 897776 | - | INSERT-THREADED | New | Y | 13 | 13 | 16 |
| 85-891969_U | 01 | 85-891969_U1A1 | Current | N | 4 | 4 | 4 |
| 86-8919668D | 01 | 86-8919668DUP | Current | N | 4 | 4 | 4 |
| 891969 | - | BOOT-SPARKPLUG | Current | N | 4 | 4 | 4 |
| 8M0034758 | A | BOOT-SPARK PLUG 90 DEG | New | N | 4 | 4 | 4 |
| 401386 | C | NUT-M6 HEX NYL INSERT | Current | N | 5 | 5 | 5 |
| 855264 | B | TERMINAL-RECEPICAL | Current | N | 14 | 14 | 13 |
| 88552516 | B | SCREW-M6 X 16 HEX FLAN | Current | N | 9 | 9 | 11 |
| 8M0024365 | 02 | SKELETON-MECHANISM | New | N | 7 | 7 | 9 |
| 819519 | B | TERMINAL-RECEPTACLE | Current | N | 6 | 6 | 8 |
| 86-62652DU | B | 86-62652DUP | Current | N | 5 | 5 | 5 |
| 609116 | J | SLEEVING HEAT REACTIVE | Current | N | 4 | 4 | 4 |
| 86898830115 | N | CLAMP-OETKER#1670100 | Current | N | 5 | 5 | 5 |
| 831956 | B | TPA - 2 WIRE | Current | N | 3 | 3 | 3 |
| 8M0034726 | 02 | O-RING SHOCK PISTON | New | N | 3 | 3 | 3 |
| 832866 | B | 409051 O RING (010-90) | Current | N | 4 | 4 | 4 |
| 832862 | B | 409815 O RING (007-90) | New | N | 4 | 4 | 4 |
| 28421 | E | WASHER-1 1/2x33/64x1 | Current | N | 6 | 6 | 6 |
| 8267117 | D | NUT-500-20 (NYLON) | Current | N | 6 | 6 | 6 |
| 821833 | A | TERMINAL-RECEPTACLE | Current | N | 5 | 5 | 5 |
| 8M0034348 | A | SCREW-M6X1X25 HEX | New | N | 2 | 2 | 33 |

EJS TreeGrid — 1072 items

Unique List of Items

Export to Excel

| Item ID | Revision | ItemName | New/Current Part | New Supplier to Mercury | 8M0026675 | 8M0032234 | 8M0032240 |
|---|---|---|---|---|---|---|---|
| | | | New | Y | 0 | 0 | 0 |
| 897776 | - | INSERT-THREADED | New | Y | 13 | 13 | 16 |
| 8M0033981 | 03 | BEARING | New | Y | 4 | 4 | 0 |
| 400632 | A | NUT-M4X0.7 HEX LOCK | New | Y | 3 | 3 | 2 |
| 8231871 | A | SCREW-M4X14.5 RD HD SQ | New | Y | 3 | 3 | 2 |
| 8M0040064 | A | COMPRESSION LIMITER | New | Y | 2 | 2 | 2 |
| 8M0033361 | 05 | COVER CRANKCASE | New | Y | 1 | 1 | 1 |
| 8M0045862 | 01 | CAMSHAFT COVER ASSEM | New | Y | 1 | 1 | 0 |
| 8M0033397 | D | Access_Panel | New | Y | 1 | 1 | 0 |
| 8M0034063 | D | REAR PANEL ASSY | New | Y | 1 | 1 | 0 |
| 8M0045842 | 01 | BALANCE TENSIONER | New | Y | 1 | 1 | 0 |
| 8M0040025 | 02 | COVER BALANCE SYSTEM | New | Y | 1 | 1 | 0 |
| 8M0040023 | 02 | MOUNT BALANCE SYSTEM | New | Y | 1 | 1 | 0 |
| 8M0040027 | 02 | BALANCE SHAFT HOUSING | New | Y | 1 | 1 | 0 |
| 8M0043033 | 01 | BALANCE SHAFT ASSY | New | Y | 1 | 1 | 0 |
| 8M0036720 | D | LOWER COWL FRONT ASM | New | Y | 1 | 1 | 0 |
| 8M0033161 | C | LOWER COWL STBD | New | Y | 1 | 1 | 0 |
| 8M0033159 | D | LOWER COWL STB ASY | New | Y | 1 | 1 | 0 |
| 8M0033163 | C | LOWER COWL PORT | New | Y | 1 | 1 | 0 |
| 8M0033162 | D | LOWER COWL PORT ASY | New | Y | 1 | 1 | 0 |
| 8M0032039 | 08 | LOWER COWLING ASY | New | Y | 1 | 1 | 0 |
| 8M0033419 | J | TOP COWL | New | Y | 1 | 1 | 0 |
| 8M0031342 | C | TOP COWL ASSEMBLY MER | New | Y | 1 | 1 | 1 |
| 8M0031504 | 06 | SHIFT SHAFT-XLONG | New | Y | 1 | 0 | 0 |
| 8M0033763 | B | TENSIONER ASSY TIMING | New | Y | 1 | 1 | 0 |

EJS TreeGrid v8.9     39 items

SYSTEMS AND METHODS OF SUPPORTING A PRODUCT LIFE CYCLE MANAGEMENT (PLM) IMPLEMENTATION

FIELD

The present disclosure relates to product life cycle management (PLM) and more specifically systems and methods of automatedly managing life cycle and bill of materials (BOM) of a product development project with parts planning applications.

BACKGROUND

In PLM systems, developmental programs are often operated from massive spreadsheets utilizing hundreds of columns, and even possibly thousands of rows. In such developmental programs, millions of data pieces are shared between cross-functional global users in a number of different locations. Traditionally, these programs utilized either a spreadsheet as mentioned above, or an engineering product data management (PDM) application in order to attempt to keep track and organize the large amounts of data pieces associated with such a program. However, utilizing these solutions independently results in a high cost of manual data entry, high product complexity, and potential user confusion. Furthermore, the manual BOM items/structure reconciliation caused accuracy errors, and utilizing either a PDM or an enterprise resource planning (ERP) application, which are currently both present systems in most user environments, caused integration issues. Resultingly, utilization of either a spreadsheet or a PDM required that a full-time employee was needed just to maintain the system.

As discussed previously, spreadsheets have been used in an attempt to manage disparate data within such PLM systems, with little success. Such projects included too much information, and too many columns and rows to efficiently manage and keep track of all of the parts involved with such a project. The number of individuals in many locations accessing the spreadsheet to keep the information in the spreadsheet up to date caused a high incidence of accidental deletions or modifications of information.

Other previously attempted solutions included utilizing a PDM application to manage attributes of such a PLM project in tabbed form having security by specific production group. This solution included a pilot server and a typical PDM application to organize engineering product data for a user. This solution was not suitable for such a PLM project, as such PDM applications fail to produce useful reports from the information collected, and were overwhelmed by the amount of attribute information required by a typical PLM project, causing failure of the pilot server.

SUMMARY

The present disclosure stems from the inventors' research and development of improved systems and methods for increasing the efficiency and reliability of PLM. The present inventors have recognized that existing applications cannot be utilized to provide data integrity through visibility and automation and significantly reduce manual reconciliation of data in PLM.

The systems and methods of the present application include a parts planning application (PPA) configured such that a BOM structure is automatically managed from a PDM application, while supporting multiple product assemblies within a common project space and operating from a common code base. The PPA of the present application includes cross-functional attribute participation and is editable by all users simultaneously worldwide, thus eliminating the need for a dedicated data administrator. The PPA of the present application enables daily or weekly management reviews, and attributes security managed by the functional group. The PPA of the present application fosters reduced data entry due to automated population of design structure and attributes from an existing PDM application and/or an ERP application. An audit trail function records and displays bill of material and user-data entry changes, and utilizes a web-based application with spreadsheet-style and/or tabbed-style interface for ease of use.

In one aspect of the present application, a computerized method of supporting a product life cycle management (PLM) implementation includes receiving in an enterprise resource planning (ERP) application an input seed file from a parts planning application (PPA), wherein the input seed file is a request for an ERP attribute, sending from the ERP application to the PPA an output attribute file, wherein the output attribute file includes the requested ERP attribute, receiving in the PPA a set of data including a bill of material and a set of corresponding bill of material attributes for an engineering assembly, and integrating the output attribute file and the bill of material data in a configurable graphical user interface, wherein the graphical user interface allows a plurality of users to manage project attributes within the engineering bill of material framework.

In another aspect of the present application, a computer readable medium having computer executable instructions for performing a method of supporting a product life cycle management (PLM) implementation including receiving in an enterprise resource planning (ERP) application an input seed file from a parts planning application (PPA), wherein the input seed file is a request for an ERP attribute, sending from the ERP application to the PPA an output attribute file, wherein the output attribute file includes the requested ERP attribute, receiving in the PPA a set of data including a bill of material and a set of corresponding bill of material attributes for an assembly, and integrating the output attribute file and the bill of material data in a single graphical user interface, wherein the graphical user interface allows a plurality of users to manage the bill of material for the assembly.

In another aspect of the present application, in a computer system for supporting a product life cycle management (PLM) implementation having a graphical user interface including a display and a selection device, a method of managing a bill of material for an assembly with a plurality of users includes receiving at least one attribute from an enterprise resource planning (ERP) application, receiving a set of data from including a bill of material and a set of corresponding bill of material attributes for an assembly, integrating the at least one attribute and the set of data in the graphical user interface, configuring the integrated at least one attribute and the set of data in a plurality of specialized views by the user, saving any of the plurality of specialized views by the user, modifying the set of data by the user, and making a record when the set of data is modified by the user.

During their research and development, the inventors invented improved systems and methods of supporting a product life cycle management (PLM) implementation, which are described and depicted in this disclosure.

BRIEF DESCRIPTION OF THE FIGURES

FIG. 10 is an example of a graphical user interface (GUI) of a product life management (PLM) system showing an example of the PPA audit trail within the homepage.

FIG. 12 is an example of a GUI of a PLM system showing an example of a PPA default view page within the spreadsheet-style interface.

FIG. 13 is an example of a GUI of a PLM system showing examples of default views for a unique list of items page and methods for selecting and modifying a user created view.

FIG. 14 is an example of a GUI of a PLM system showing an example of a tree structure view page within the spreadsheet-style interface.

FIG. 15 is an example of a GUI of a PLM system showing an example of a default view page within the tabbed-style interface.

FIG. 16 is an example of a GUI of a PLM system showing an example of a unique list of items page showing multiple top-level product structures.

FIG. 17 is an example of a GUI of a PLM system showing an example of a unique list of items page showing filtering and sorting capabilities within multiple top-level product structures.

FIG. 18 is an example of a GUI of a PLM system showing an example of a cost and weight roll-up view.

DETAILED DESCRIPTION OF THE FIGURES

In the present description, certain terms have been used for brevity, clearness and understanding. No unnecessary limitations are to be implied therefrom beyond the requirement of the prior art because such terms are used for descriptive purposes only and are intended to be broadly construed. The different systems and methods described herein may be used alone or in combination with other systems and methods. Various equivalents, alternatives and modifications are possible within the scope of the appended claims. Each limitation in the appended claims is intended to invoke interpretation under 35 U.S.C. §112, sixth paragraph only if the terms "means for" or "step for" are explicitly recited in the respective limitation.

Figure 1:
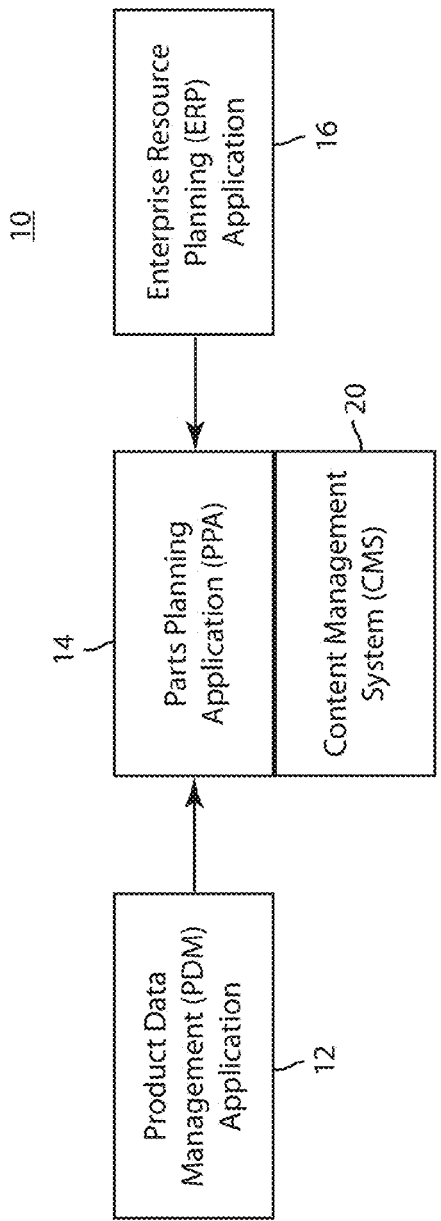
FIG. 1 is a block diagram of an exemplary product life cycle management system.

Referring to FIG. 1, a product life cycle management (PLM) system 10 of the present application is illustrated. Here, the system 10 includes a product data management (PDM) application 12, a parts planning application (PPA) 14, a content management system (CMS) 20, and an enterprise resource planning (ERP) application 16. Typical ERP applications 16 are legacy mainframe systems, including but not limited to PIMS or commercially available off the shelf (COTS) ERP systems, and generally track transactional data, accounting, procurement and human resources data. The PDM application 12 is engineering enterprise software or engineering product data software, including but not limited to the Teamcenter® application. The CMS 20 is a web platform application and/or a document repository. Typical non-limiting examples of such a CMS 20 include Microsoft SharePoint® or Google® docs. The PPA 14, in the illustrated embodiment, is installed on the CMS 20, but it will be understood to those skilled in the art that the PPA 14 may be installed on top of such a CMS 20, a database platform, or freestanding, so that it may run freely and talk to different database architectures. In one embodiment, the PPA 14 is a browser-based application tool that installs on top of one of the aforementioned systems. In one embodiment, the PPA 14 is a .net application, but it should be understood by one skilled in the art that various software frameworks may be utilized in order to capture the functionality of the PPA 14. The PPA 14 may be embodied on any computer readable medium, including but not limited to, floppy disks, conventional hard disks, CD-ROMs, nonvolatile ROM, and RAM.

Figure 2:
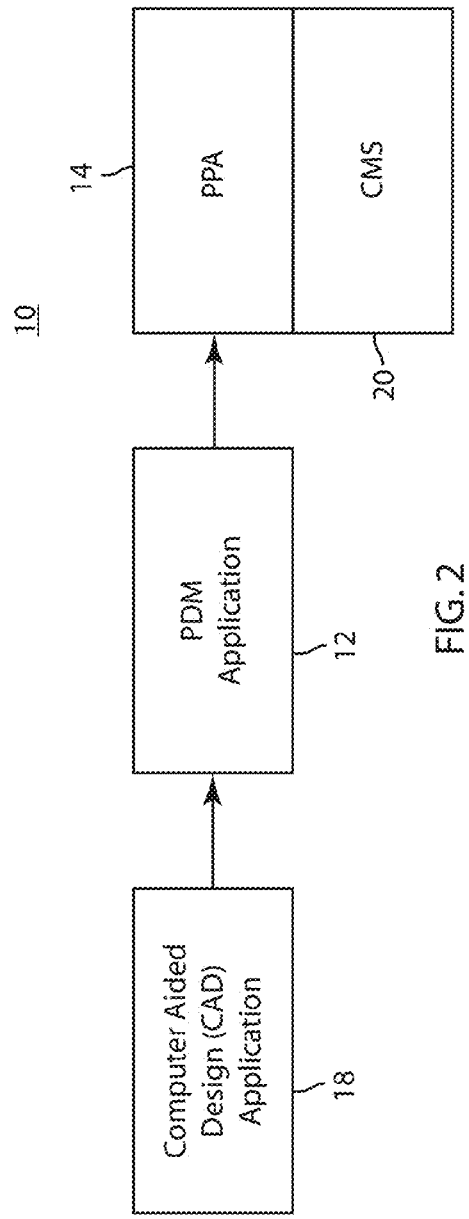
FIG. 2 is a block diagram of an exemplary product life cycle management system.

Referring now to FIG. 1 and FIG. 2 simultaneously, the PLM system 10 includes the PPA application 14 installed on top of the CMS 20, the PDM application 12 and a computer-aided design (CAD) application 18. The PPA application 14 receives engineering bill of material (BOM) information from the PDM application 12, and further transactional data from the ERP application 16, and provides a single organizational and interface solution for a PLM system 10 user. As discussed previously, it should be understood that the operation of the PPA application 14 is implemented by a set of executable code stored in a storage medium (not shown) of the PLM system 10. It should be further understood that the PPA 14 will be installed in a system or a device having such storage medium and a processor, such that when the executable code is executed by the processor, the operation of the PPA application 14 is effectuated. Furthermore, the executable code will further effectuate the integration of the PPA application 14 with the ERP application 16, the PDM application 12, and the CMS 20.

Referring again to FIG. 2, the PDM application 12 provides engineering BOM information to the PPA application 14. Any amount of the BOM information may originate from the CAD application 18. The CAD application 18 may include any of a number of modeling applications known in the art. In operation, the user of the CAD application 18 creates a part rendering with the CAD application 18, and saves it into the PDM application 12. When that part is saved in the PDM application 12, it is added to an engineering BOM, and thus collected and saved by the PPA application 14. Of course, entries to the BOM may be made in the PDM application 12 through other entry methods other than a rendering by the CAD application 18.

Figure 3:
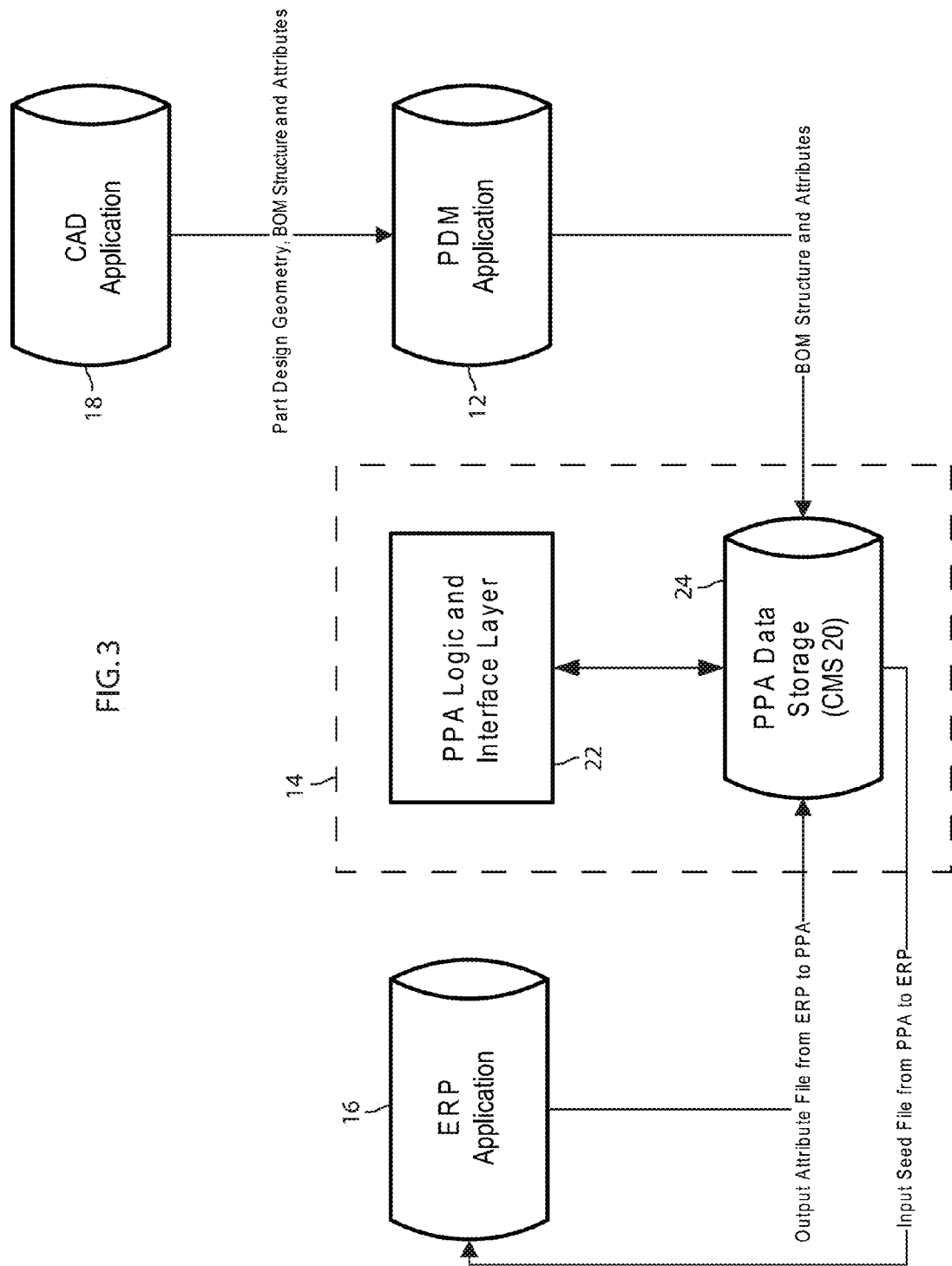
FIG. 3 is a block diagram of an exemplary product life cycle management system.

Referring to FIG. 3, again the CAD application 18 forwards part design geometry, BOM structure, and attributes to the PDM application 12, and then a BOM structure and attributes are forwarded to the PPA application 14. Parts design geometry, BOM structure and attributes may also be manually entered into the PDM application 12, or directly into the PPA application 14. In FIG. 3, it is illustrated that the PPA application 14 includes both a PPA logic and interface layer 22 and PPA data storage 24. In one embodiment, the PPA data storage 24 is the CMS 20 of FIG. 1. As discussed above however, it should be understood that the PPA data storage 24 may also be part of the PPA application 14 and include any other data storage and/or management system known in the art. Again, the PPA data storage 24 may be part of the PPA application 14, or configured separately but in communication with the PPA application 14. The ERP application 16 transmits attributes using methods familiar to those skilled in the art to the PPA 14 and receives an input seed from the PPA application 14, which will be discussed in greater detail below.

Figure 4:
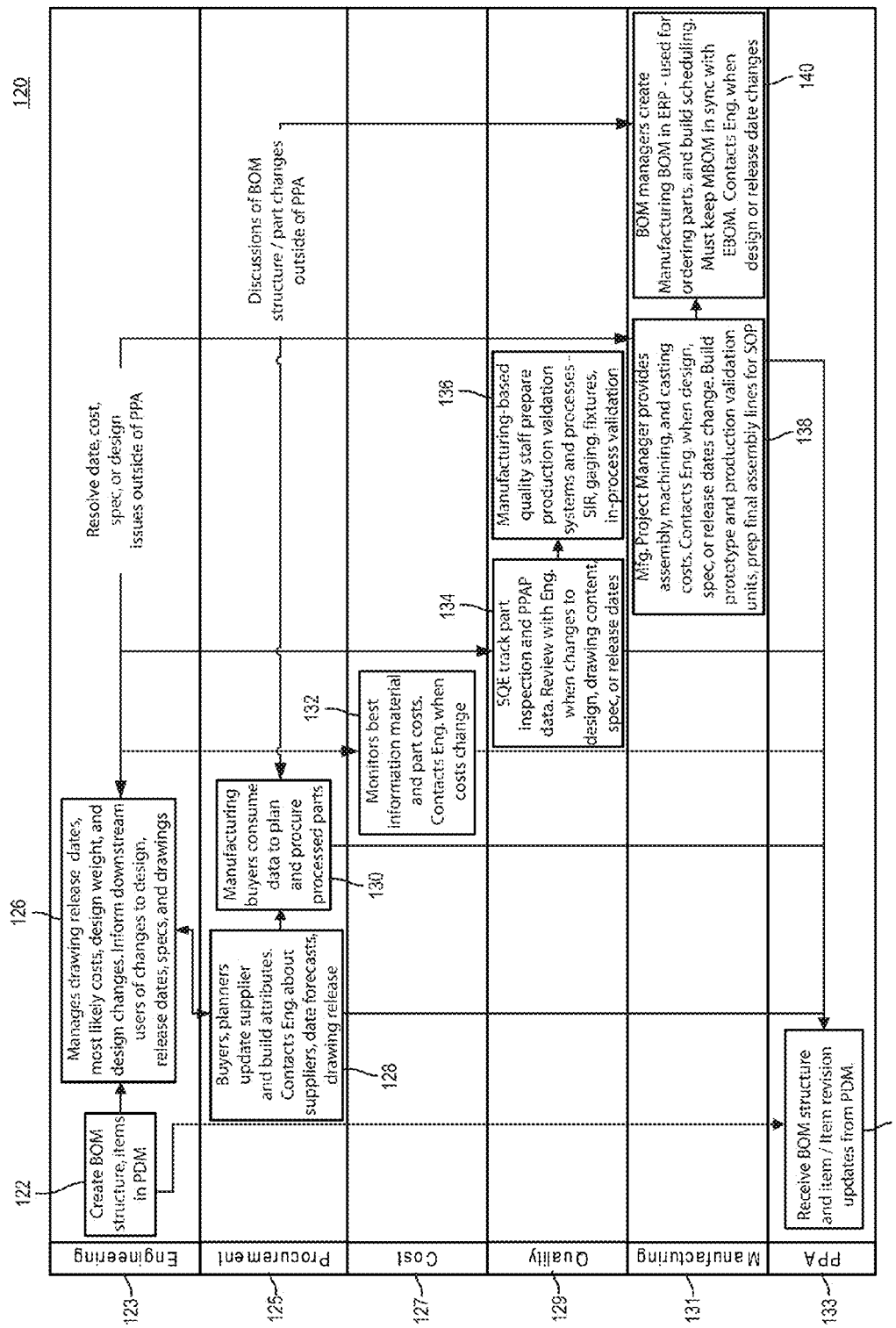
FIG. 4 is a flowchart showing an example of a PPA cross-functional method.

Referring now to FIG. 4, a cross-functional method 120 of the present application is illustrated. In step 122, information including a bill of material (BOM) is created by engineering 123 and sent to the PPA 133. In step 124, the BOM is received in the storage/application layer of the PPA 133 along with any revision updates. In step 126, information from the PDM is used within the PPA 133, and all the metadata from projects is being managed. Such information includes all the attributes across the scheme of the program, including but not limited to, drawing release dates, most likely costs, design weight and design changes.

In step 128, interchange occurs between the engineering group 123 and the procurement group 125. In step 128, the buyer from the procurement group 125 communicates with the buyer of a potential supplier team, including such information as: whether engineering information has been exchanged, whether the engineer contacted their engineer directly, whether there been discussion of PO numbers, and/or whether there has been discussion of engineering, prototyping or cost. Referring to step 124 again, the PPA 133 is holding the attributes and the design structure that is associated with the attributes, and assists to facilitate the interaction between the engineering group 123 and the procurement group 125, and makes a common data viewing and reporting in the PPA 133 possible from those interactions.

In step 130, the procurement group 125 determines whether the parts in the BOM are internally produced or are a purchased part, and when the manufacturing group 131 needs to get involved in their manufacturing bill structure in step 140, for example, if a manufacturing bill structure requires that the part go out to a supplier to get heat treated or special coated or some other manufacturing process. In step 132, the cost group 127 monitors target costs, most likely costs, quoted costs, and best information material and part costs and contacts the engineering group 123 when costs change. The cost group 127 also talks to other buyers. In step 134, there is interplay between the engineering group 123 and the quality group 129. The quality group 129 tracks part inspection and PPA 133 parts data, and reviews this information with the engineering group 123 when changes to the design, drawing content, specification, or release dates occur. In step 136, the quality group 129 prepares production validation systems and processes, pertaining to gauging, fixtures, in-process validation, and production-readiness documentation.

In step 140, there is interplay with the manufacturing group 131 and the engineering group 123. The manufacturing group 131 usually includes a project manager and a bill of material manager. The project manager communicates with the quality, cost, procurement and engineering groups 129, 127, 125, 123 to confirm what parts are going to be purchased, what parts are going to be made, what parts are going to be made at what plant if they are internally made, what parts need outside further processing if its made internally, what's the potential cost because you have to have fixed labors, burdens, and other part information required by the particular project. The PPA 133 assumes that the engineering BOM is not the final assembly BOM and routes to manufacturing to structure a final assembly BOM to assemble the product. The bill of materials manager, in box 140, keeps the manufacturing bill of material and the engineering bill of materials in sync and receives notification from the engineering group 123 when a design or a release date changes.

The information interplay between the bill of materials manager and the engineering group 123 is stored in the PPA 133. Typically, the procurement group 125 includes essentially three categories of procurement helpers. One is a project manager, who is the procurement counterpart to the manufacturing project manager. There is also a commodity manager and a buyer.

Figure 5:
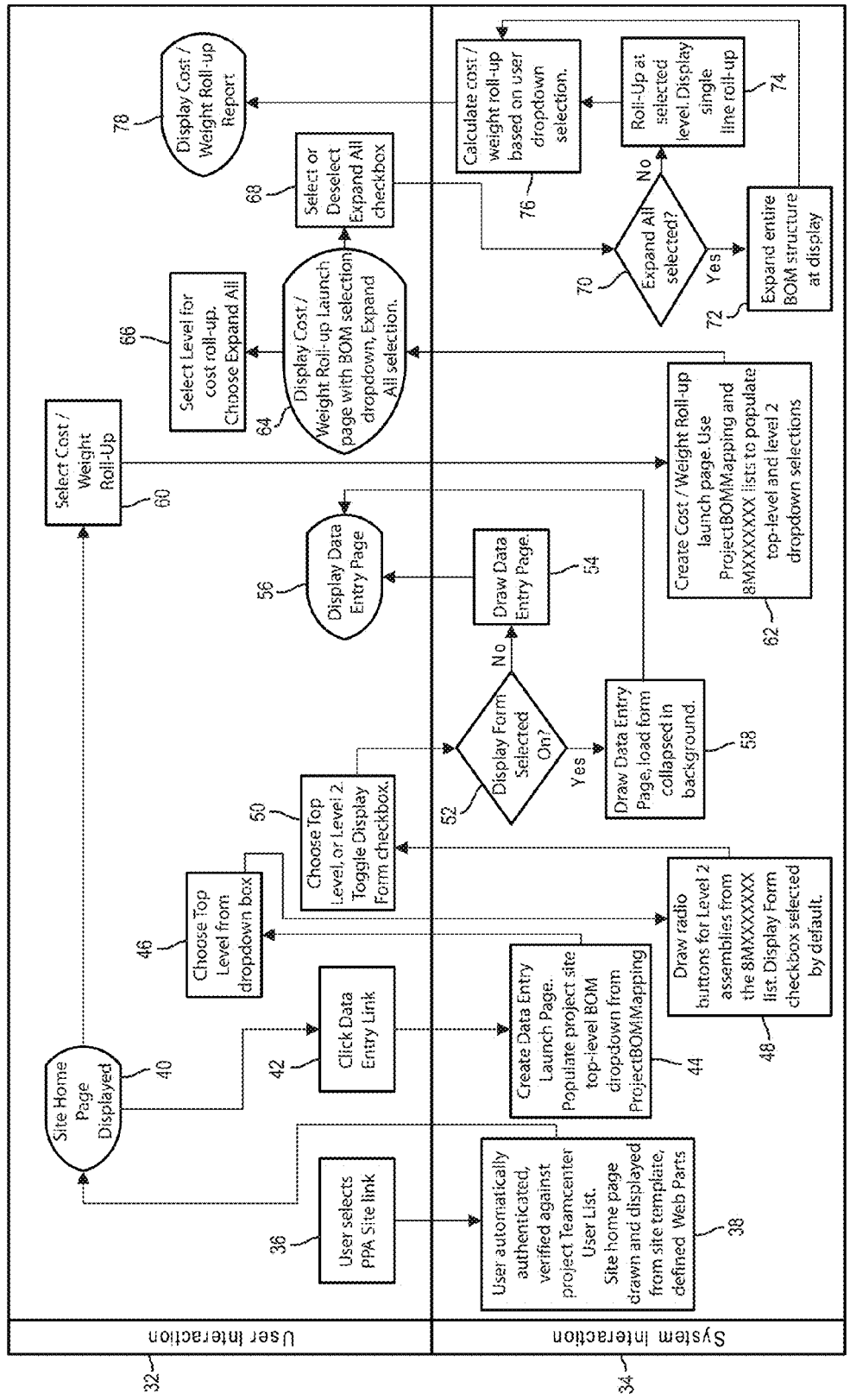
FIG. 5 is a flowchart showing an example of a PPA user/system interaction method.

Referring now to FIG. 5, a PPA user/system interaction method 30 is illustrated. The user interaction steps 32 illustrate what steps the user carries out, and system interaction 34 illustrates the PPA function. It should be noted here, that in FIG. 5, the user interaction steps 32 are carried out by a user utilizing an input/output device known in the art, as well as a display and/or a graphical user interface for interacting with the system of the present application. It should be further noted that any of the methods depicted in the following figures that include user interaction steps also include these components to assist the user in carrying out such steps.

In step 36, the user selects the PPA site link, and a navigation link opens up. In step 38, authentication of the user is carried out. In one embodiment, two levels of security are present in the system. The first level of security is a CMS security level. If the user has access to the site, then the first level of security is circumvented. The second security layer verifies the user's role, i.e., procurement, manufacturing, quality, cost, etc. Based on that role, the system allows the user to manage a preselected set of data in the system. For example, if the user is a cost engineer, the user may only be able to edit cost fields. A quality engineer may only be able to edit quality-related fields.

In one embodiment, this authentication is done on the CMS or PPA site. In step 40, the site homepage appears on a display, and displays the PPA's homepage to the user.

Still referring to FIG. 5, in step 42, the user selects data entry by selecting the data entry link and the user is then able to create a launch page in step 44. In one embodiment, the launch page has a list of value boxes that allow the user to select which bill structure to enter in within step 46. The interface then creates a set of radio buttons in step 48 based on the bill structure selected, and the user is able to pick from that radio button list in step 50. After step 50, the system makes a decision in 52. If in step 50 the user refused a toggle, then the system will draw a data entry page in step 58 without access to a tab interface, and if they chose the toggle, then the system draws the data entry page in step 54 with access to the tab interface and displays the data entry page in 56. There the user may add or change data based on their role.

In step 60, the user selects the cost weight roll-up report view. The cost weight roll-up works somewhat similar to step 38 and brings up the launch page in step 62. Once the launch page is brought up, the user again chooses in step 64 the BOM selection drop down. In step 66, a level is selected and expanded. In step 68, the user may expand all so the full bill and indent may be viewed. In 70, the system performs a number of calculation steps based on whether the user expanded or not. Step 76 is then the calculating step, and 78 is the final display based on user preference.

Figure 6:
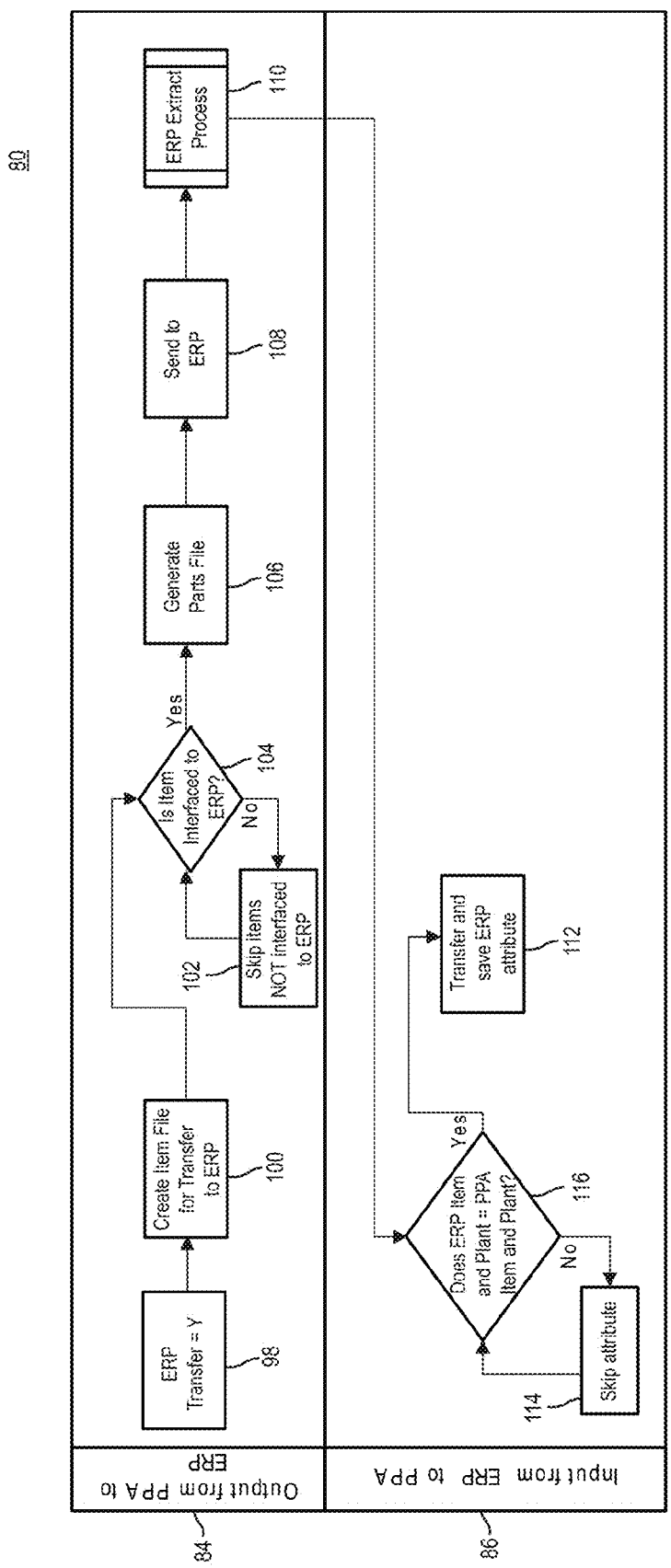
FIG. 6 is a flowchart showing an example of an ERP data management method.

Referring now to FIG. 6, 84 includes the output steps from PPA to ERP, and a seed file that is sent to ERP, so the ERP recognizes what to give back to the PPA. If there are 10

PPAs, all 10 PPAs use the same seed file. This is the reason the PPA creates items for transfer to the ERP. Therefore, in step 98, when ERP transfer=y, then in step 100, an item file is created for transfer to the ERP. If this item is interfaced to the ERP in 104, then a parts file is generated in step 106. If the item is not interfaced to the ERP in 104, then those items are skipped in step 102. In step 108, the parts file of step 106 is sent to the ERP, and in step 110, the ERP conducts its extraction process based upon the seed file.

Still referring to FIG. 6, and now moving to the input from the ERP to the PPA 86, in step 116, if the ERP item number and plant designation extracted from step 110 equals the PPA item and plant designation, then the associated attributes are transferred and saved into the PPA. Moving back to step 116, if the ERP item and plant numbers do not match the PPA item and plant designations, then the attribute is skipped in step 114.

Figure 7:
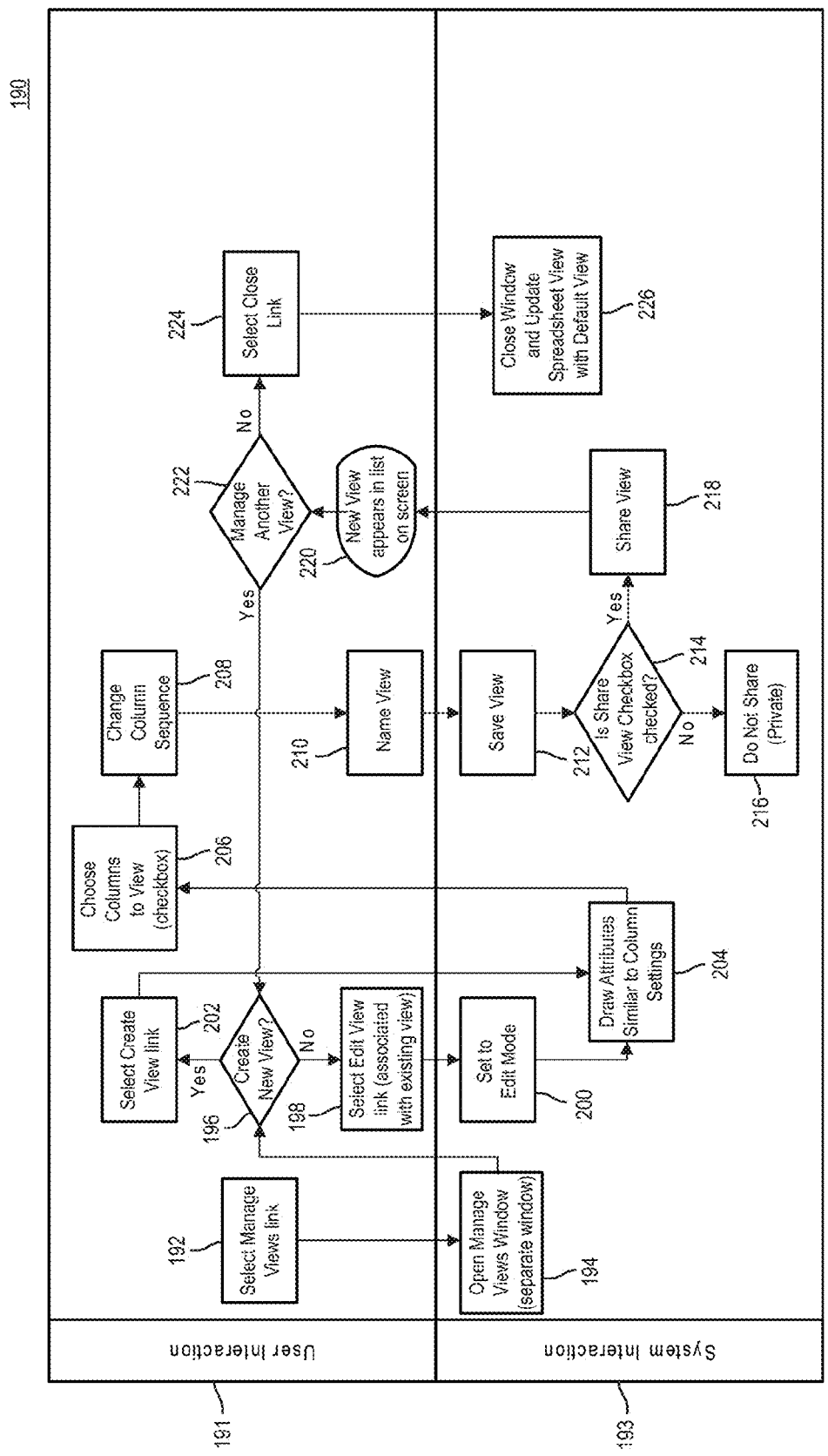
FIG. 7 is a flowchart showing an example of a multiple view management method

Referring now to FIG. 7, a multiple view management method of the present application is illustrated. The functionality described allows a user to create as many views with pre-defined filters, attributes (columns), attribute (column) sequence, then have a name applied to the view, and publish it as an interactive tool for themselves or other project participants to review or contribute data. Again, this method 190 includes user interaction steps 191, as well as system interaction steps 193. In step 192, a user selects the manage views link, and the PPA opens a manage views window, in either a separate or the same window as the user is currently viewing. In step 196, it is determined whether the user wishes to create a new view, and if so, the user selects the create view link in step 202, and the system draws attributes similar to column settings in step 204. If the user does not wish to create a new view in step 196, then the user selects the edit view link associated with the existing view in step 198, and the system sets to an edit mode in step 200, and further draws attributes similar to column settings in step 204. In either a new view or an edit view mode, the user is able to choose columns to view by checkbox in step 206, and may change the column sequence in step 208. The user then can name the view that is customized in steps 204 through 208 and step 210, and the system saves the view in step 212. If the user checks the share view checkbox in step 214, then the user can select whether to share the view. Views may be selected as public to share with everyone on the project site, role based, to share with everyone in a particular group, or private, to share with no other user. This view is shared in step 218. If this box is not checked in step 214, then the view is set as private in step 216. This view then appears in a list on the display in step 220. Then in step 222, it is determined whether the user wishes to manage another view in step 222. If so, then the method returns to step 196, and if not, the user selects the close link in step 224, and the system closes the window and updates the spreadsheet view within the newly created view in step 226. Views are considered live reporting and content contribution interfaces. Dashboard-style reports are also provided within the PPA.

Figure 8:
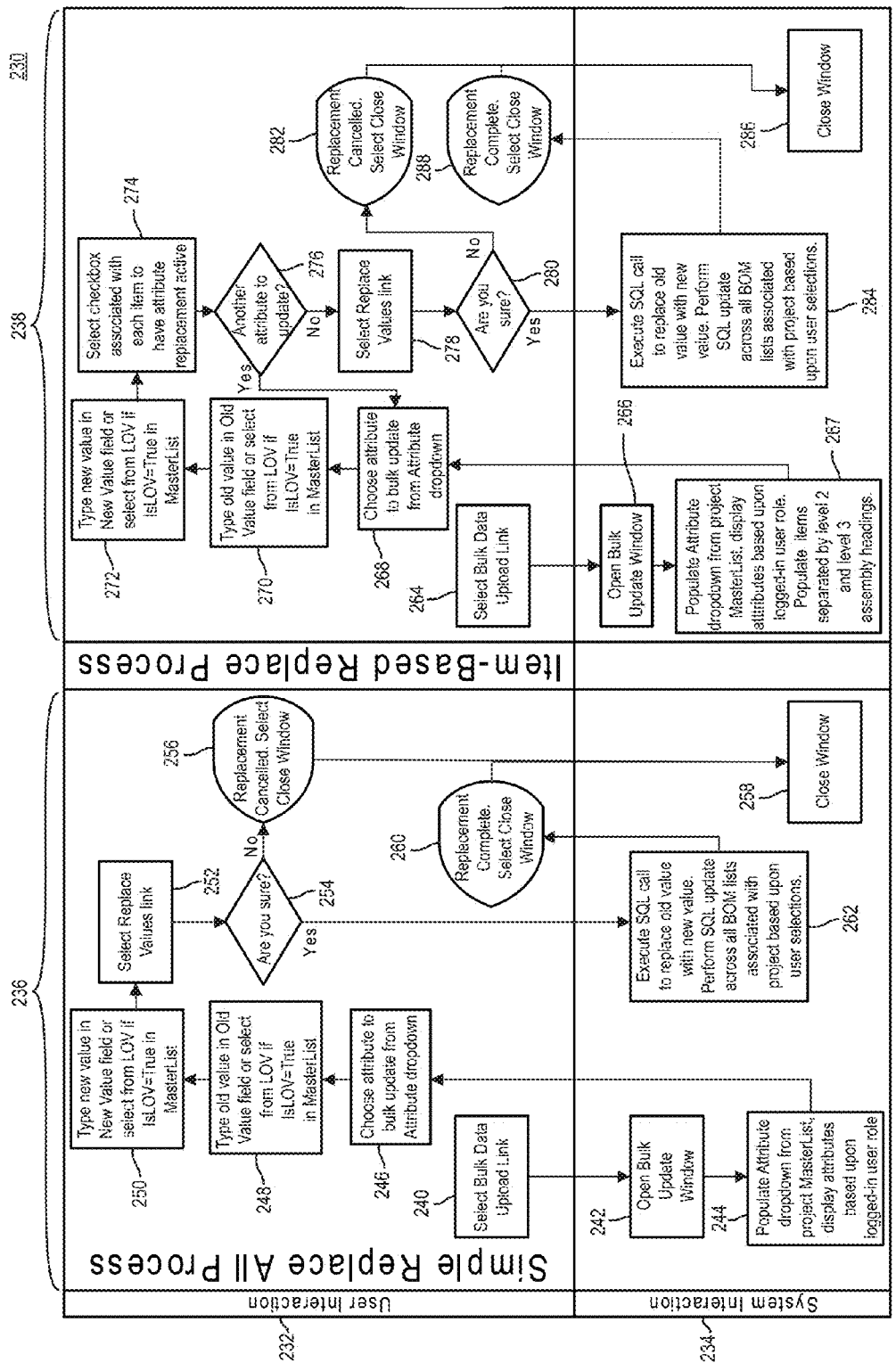
FIG. 8 is a flowchart showing an example of a bulk data update method.

Referring now to FIG. 8, a bulk data update method 230 is illustrated. Again, user action steps 232, as well as system interactions steps 234 are defined. Furthermore, FIG. 8 illustrates both a replace all method 236, as well as an item replace method 238. In the replace all method 236, in step 240, a user selects a bulk data upload link, and an open bulk update window is displayed by the system in step 242. In step 244, the system populates an attribute drop down from a project master list and displays attributes based upon a logged-in user role, as described above. In step 246, the user chooses the attribute to bulk update from an attribute drop down list. In steps 248 and 250, the user is able to type the old value to be replaced and a new value to replace the old value, and then selects the replace values link in step 252. The user will have an opportunity to confirm this change in step 254, and the replacement may be cancelled in step 256, closing the window in step 258. Furthermore, if the user is sure in step 254, then the replacement will occur in step 262, and a replacement complete will be displayed in step 260, closing the window in step 258.

Still referring to FIG. 8, the item replace method 238 includes the user again selecting the bulk data upload link 264 and the system opening a bulk update window in step 266. Steps 267, 268, 270 and 272 are similar to those set forth in the replace all method 236, but in step 274, the user selects checkboxes associated with each item to have attribute replacement. If there is another attribute to update in step 276, then the method returns to step 268, and if not, then the user selects replace values link in step 278. Steps 280, 282, 284, 286 and 288 mirror a confirmation step starting with step 254 in the replace all method 236 in order to confirm that the user indeed wants to make these replacements.

Figure 9:
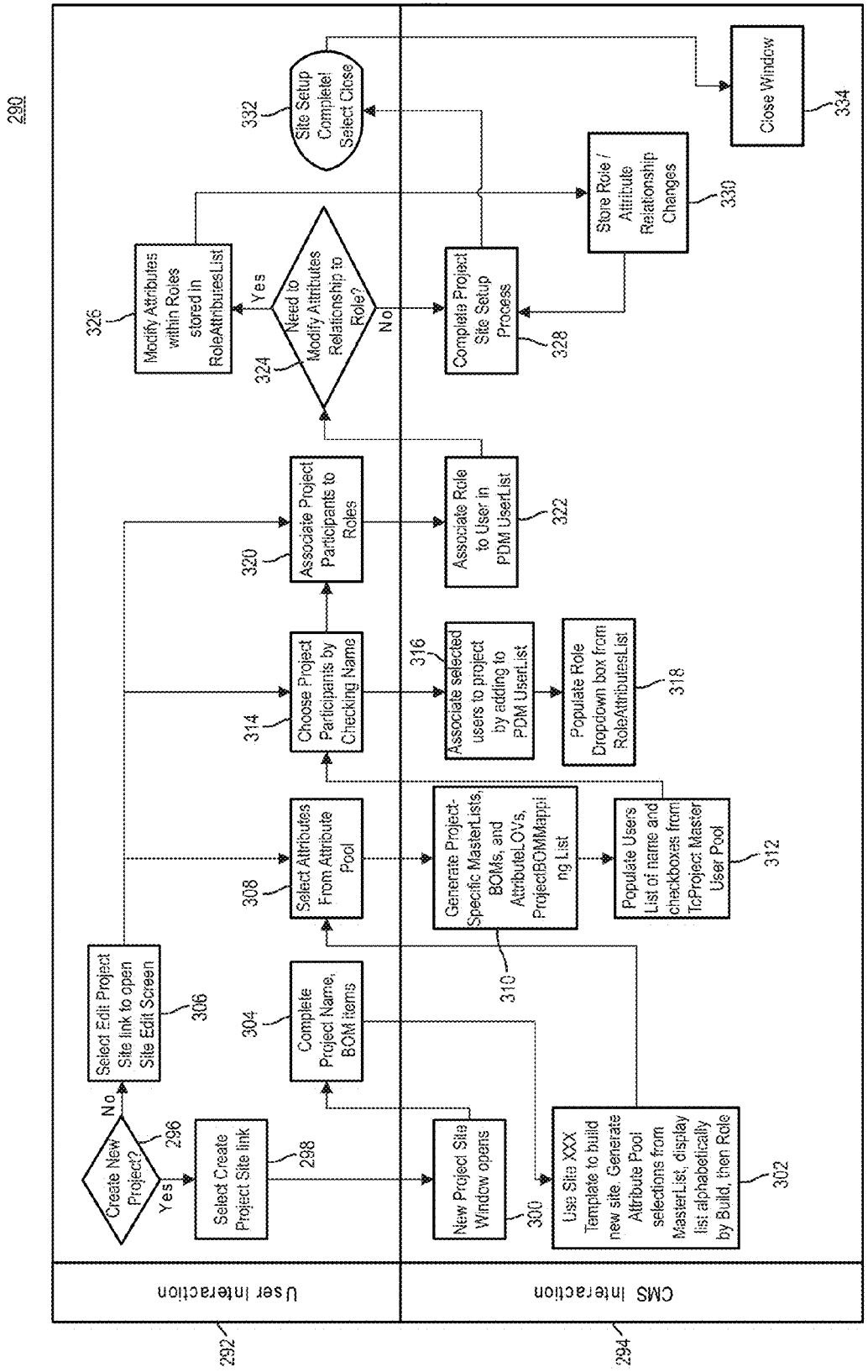
FIG. 9 is a flowchart showing an example of a contact management system (CMS) project site administration method.

Referring now to FIG. 9, a CMS administration method 290 of the present application is illustrated. Once again, user interaction steps 292, as well as CMS interaction steps 294 are identified. In step 296, if the user decides to create a new project, and selects create project site link in step 298, then a new project site window opens in step 300. The user is then prompted to complete the project name and bill of material items in step 304, and the system uses a template to build the new site, generate attribute tool selections from a master list and display the list alphabetically by bill and role in step 302. The user is then able to select attributes from an attribute pool, project participants by checking name boxes, and associate project participants by rules in steps 308, 314 and 320, respectively. Referring to step 296, if the user does not wish to create a new project, then the user selects edit project site link to open a site edit screen in steps 306, and is directed towards steps 308, 314 and 320, as well. After the user selects the attributes in step 308, the system generates project-specific master, bill of materials and attributes and project bill of material mapping lists in step 310, and populates the users lists of names and checkboxes from a project master user pool in step 312. After choosing the project participants by checking name boxes in step 314, the system associates selected users to the project by adding those names to a user list in step 316 and populating a role drop down box from a role attributes list in step 318. After selecting the project participants to roles in step 320, the system associates the roles to users in the PDM user list in step 322. Next in step 324, if the user needs to modify attributes' relationships to a particular role in step 324, then the user modifies attributes within the role stored in the role attribute list in step 326, and stores the role/attribute relationship changes in step 330. If the user does not need to modify attributes' relationship to roles in step 324, then the complete project site set-up process is done by the system in step 328, and the process complete display is made in 332, and lastly the window is closed in step 334.

Referring now to FIG. 10, a GUI 350 of the present application is illustrated. Here, one embodiment of an audit trail embedded within a homepage 352 is illustrated having an attribute audit trail 354, wherein a listing of the attribute names 356 is included. In this attribute audit trail 354 of the homepage 352, each attribute 356 includes an attribute value 358 and a modification value 360. In this view, the attribute values 358 illustrate old values and new values of any particular attribute 356, and further modification values 360 in the form of when the attribute was modified, and who modified that attribute 356. This attribute audit trail 354 creates an audit trail such that any user of the system can determine when and who modifies any attribute 356 in the system. A similar audit trail mechanism is available for bill of material changes.

Figure 11:
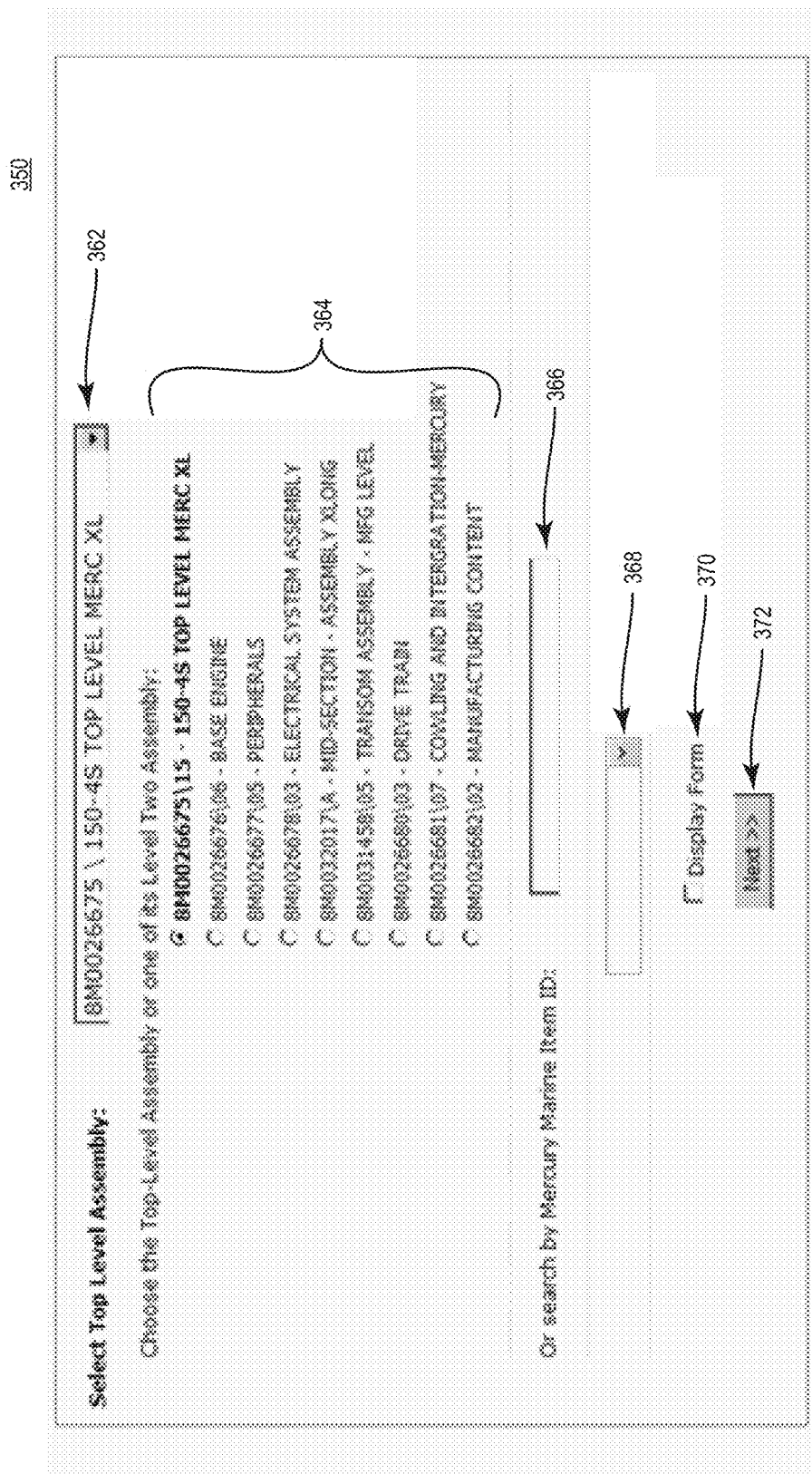
FIG. 11 is an example of a GUI of a PLM system showing an example of a PPA bill of material selection launch page.

Referring now to FIG. 11, a GUI 350 of the system of the present application is illustrating an example of a PPA bill of material selection launch page. The top level assembly selector 362 allows the user to identify the overall project or assembly that that user wishes to view and/or manipulate in the system. Once the user selects the top level assembly with the top level assembly selector 362, then the user may utilize the specific assembly selector 364 to choose a narrower listing of product structure to view and/or manipulate attributes. It should be noted that in one embodiment, the specific assembly selector 364 is not illustrated in the GUI 350 until the user selects a top level assembly with the top level assembly selector 362. This view also includes an item ID search bar 366 to search any given assembly by part number and item selector 368 that allows a user to scroll through all of the items in any of the assemblies selected by the user with the top level or specific assembly selectors 362, 364, and a display form checkbox 370 that a user can check in order to save the complete form for the selected item. Once the user is finished making selections on this view, then the retrieve bar 372 may be selected and the item may be viewed.

Referring now to FIG. 12, the GUI 350 illustrates an example of a default view spreadsheet-style interface page 374 of the present system. Here, the default view 374 includes a number of attribute columns 376 that organize a number of values for each of the attributes listed. The number of attribute columns 376 may be set by the user for any particular assembly selected.

Figure 13:
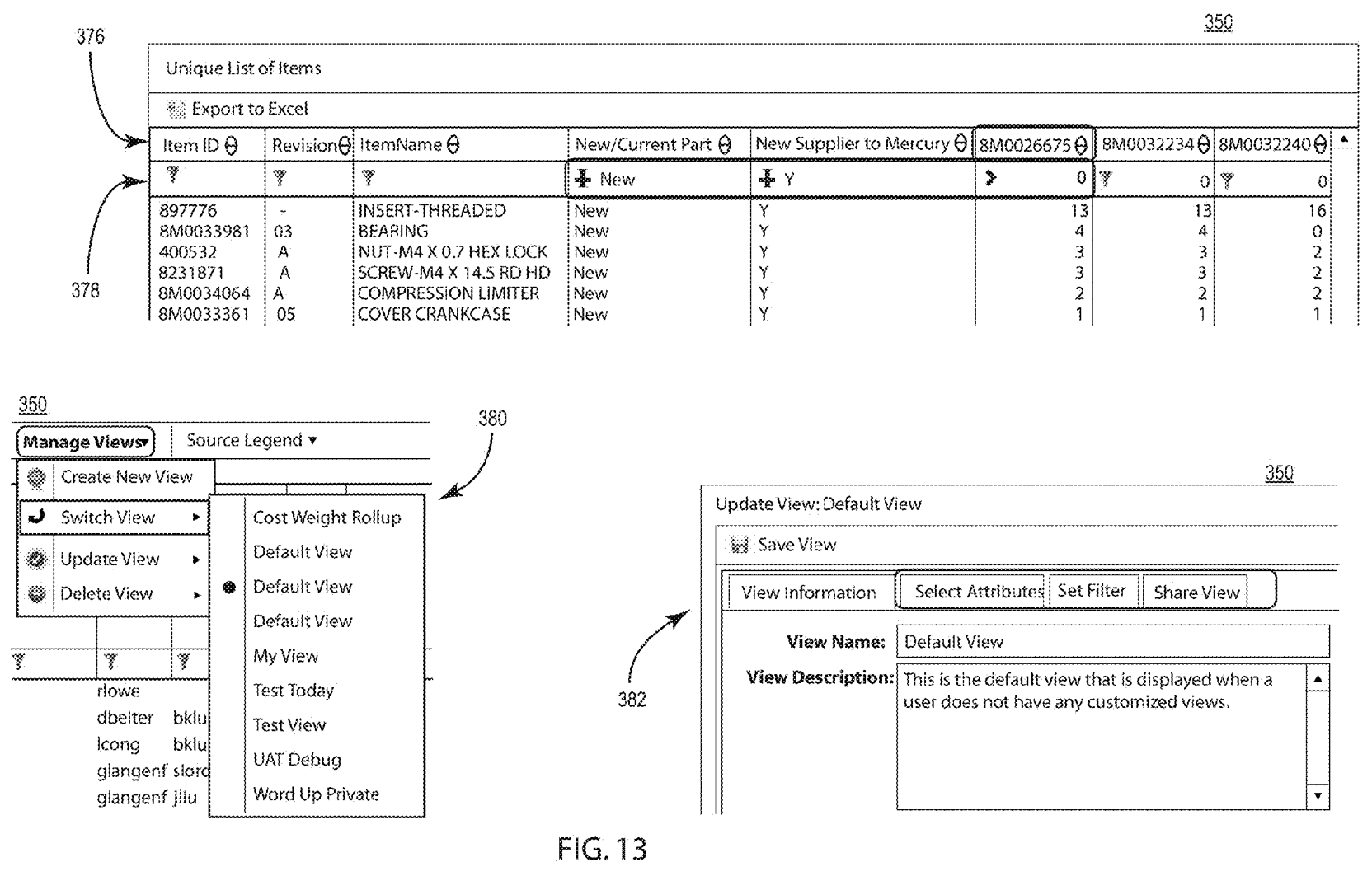

Referring to FIG. 13, a number of examples of functionality of the GUI 350 are illustrated. The filter and sort bars 378 may be configured in each of the attribute columns 376 so that the user may sort the entire list of attributes by any selected attribute column 376 by merely selecting the corresponding filter and sort bar 378 for that attribute column 376. This functionality is available within any view enabled by the spreadsheet-style interface. Furthermore, the cascading menu views 380 of the GUI 350 allow a user to change or set the default view, and also to navigate to other views. The view editor 382 allows a user to create new views, as well as manage particular existing views.

Referring to FIG. 14, the GUI 350 shows an example of a tree structure view 384 enabled within the spreadsheet-style interface of the present application. Here, for each item that includes other items, a tree format may be incorporated in order to show the user all of the items that are included in any other particular item. Alert icons 386 may be utilized to show any number of status alerts to the user.

Figure 15:
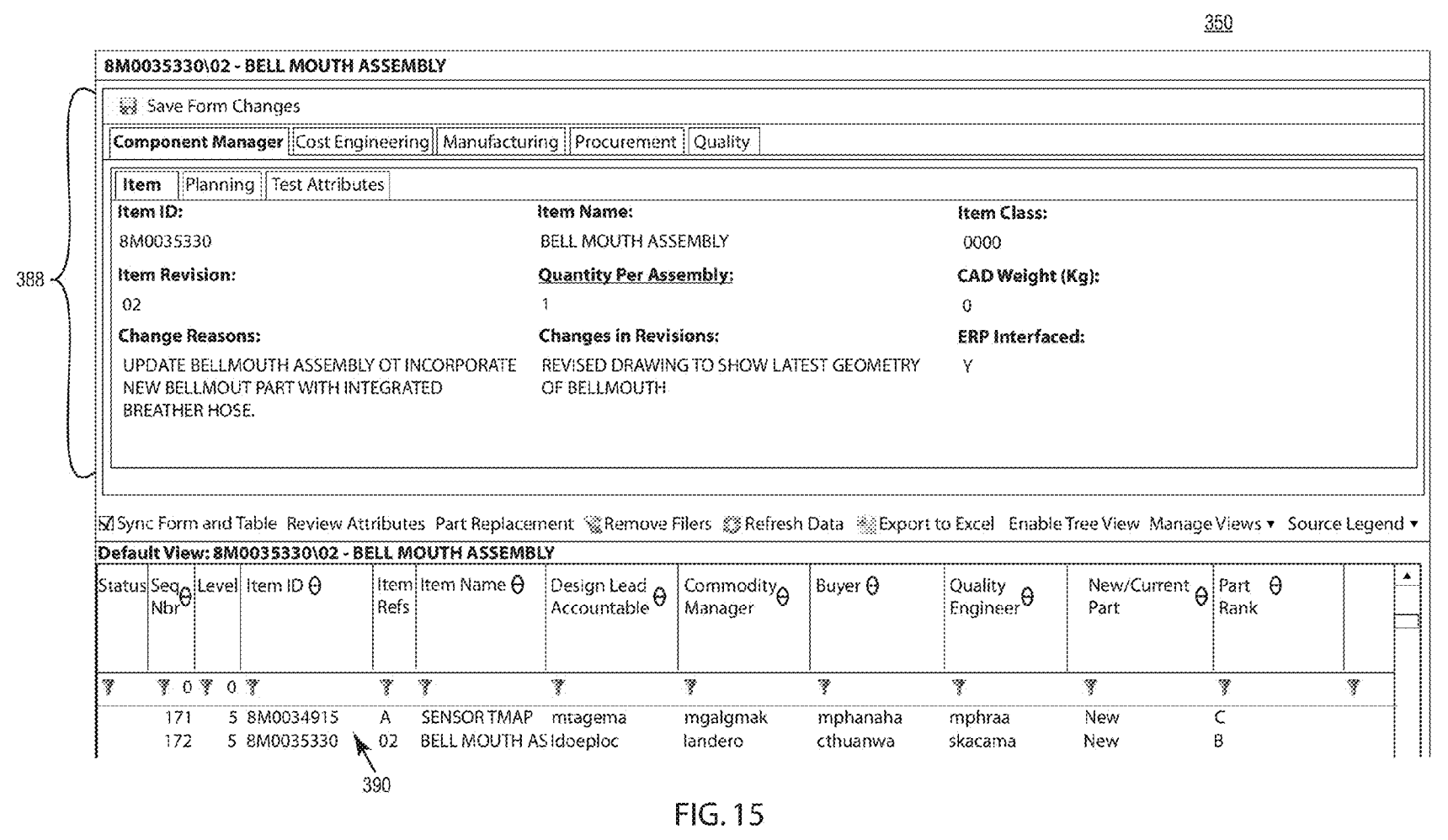

Referring to FIG. 15, the GUI 350 illustrates an example of the default view launched from the spreadsheet-style interface page, further including a tab interface 388. Here, the tab interface 388 allows a user to view a particular department's information for any given selected row 390. Here in this exemplary figure, the selected row 390 is sequence number 172, and the tab labeled "Component Manager" is selected. In addition to the item ID and the item name, the Component Manager tab includes the reasons that the item was changed and the changes in the drawings that resulted from this change. A user in any of the tabbed groups may utilize the tabbed interface 388 for such additional notation.

Figure 18:
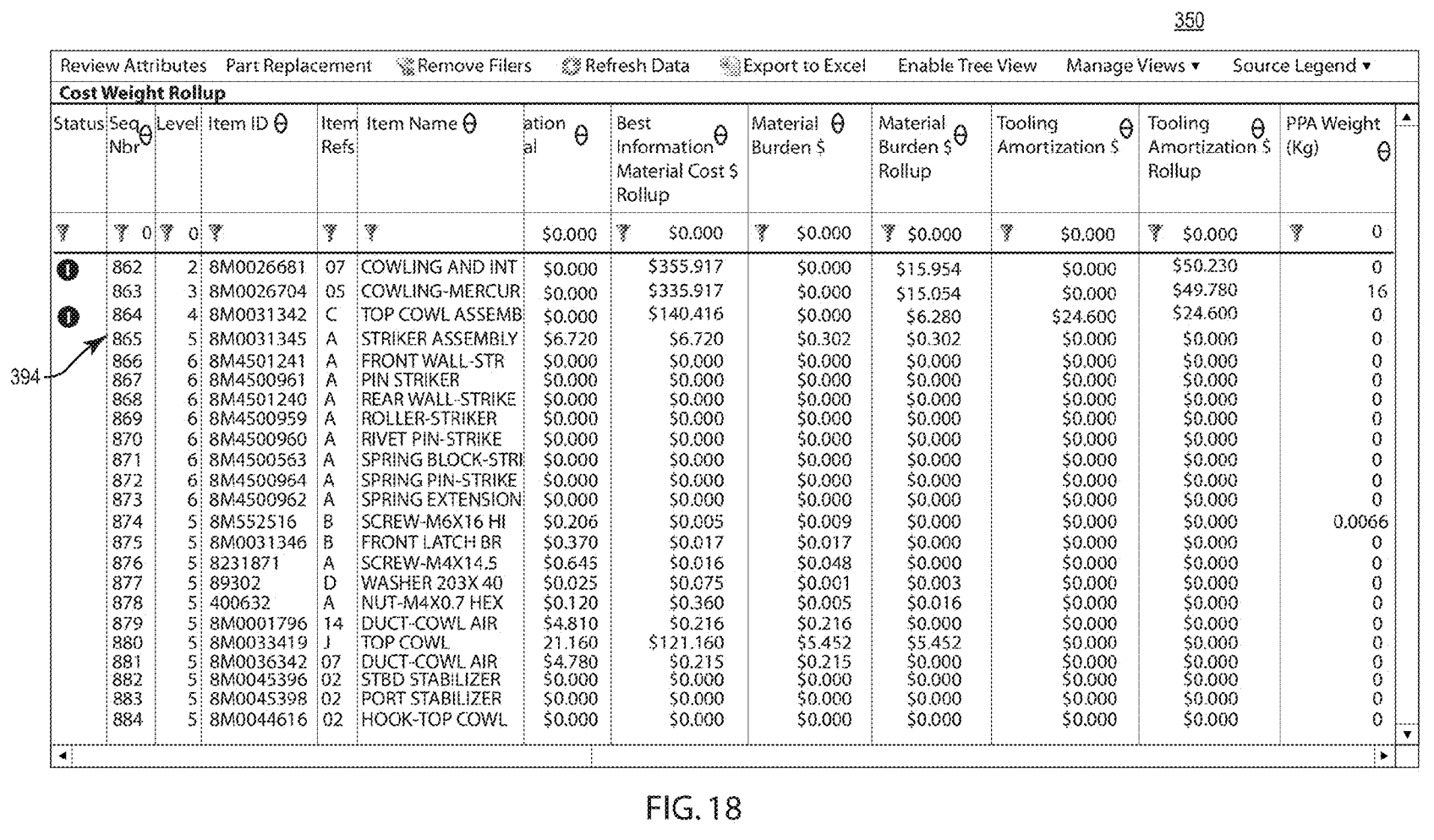

Referring now to FIG. 16, the GUI 350 illustrates an example of a unique list of items 392 page. Here, the unique list of items 392 is a listing of items that are available to the project team within any project product structure stored within the application being viewed by the user. Moving on to FIG. 17, an additional view of the unique list of items 392 is illustrated, and further filter and sort bars 378 may be utilized in this unique list of items 392 view. Once again, a user may utilize the filter and sort bar 378 to filter this unique list of items 392 using any of the attribute columns. Similarly, referring to FIGS. 18 and 19, a cost and weight roll-up view 394, wherein the cost of each item and the weight of each item is included in the view 394, also utilizes all of the tools including the filter and sort bars 378 of previous views.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computerized method of supporting a product life cycle management (PLM) implementation, the computerized method comprising:
   receiving in an enterprise resource planning (ERP) application an input seed file from a parts planning application (PPA), wherein the input seed file requests to interface with any one of a plurality of ERP attributes;
   sending from the ERP application to the PPA an output attribute file when any one of the plurality of ERP attributes interfaces with the input seed file, and does not send the output attribute file when the input seed file does not interface, wherein the output attribute file includes the requested ERP attribute and further includes a set of characteristics of the one or more requested ERP attributes;
   receiving in the PPA a set of bill of material data from a product data management (PDM) application, including a bill of material and a set of corresponding bill of material attributes for an assembly; and
   integrating the output attribute file from the ERP application and the set of bill of material data from the PDM application in a configurable graphical user interface in the PPA, wherein a plurality of users have access to the configurable graphical user interface, and the access allows each of the plurality of users to edit the bill of material for the assembly in real time.

2. The computerized method of claim 1, further comprising sending the input seed file request from the PPA and receiving the output attribute file containing the requested attribute characteristics in a PPA data storage.

3. The computerized method of claim 2, wherein the PPA data storage is a component of the PPA.

4. The computerized method of claim 2, wherein the PPA data storage is a separate content management system (CMS), further wherein the CMS is a web platform application or a document repository.

5. The computerized method of claim 2, wherein the PPA data storage is a database platform.

6. The computerized method of claim 2, further comprising receiving the set of data including the bill of material and the set of corresponding bill of material attributes in the PPA data storage from an input/output device.

7. The computerized method of claim 1, further comprising a computer-aided drafting (CAD) application providing the PDM application with the set of data including the bill of material and the set of corresponding bill of material attributes.

8. The computerized method of claim 1, further comprising receiving the set of data including the bill of material and the set of corresponding bill of material attributes in the PDM from an input/output device.

9. The computerized method of claim 1, further comprising allowing any of the plurality of users to configure a specialized view of the integrated output attribute file and the bill of material, and saving the specialized view.

10. The computerized method of claim 1, further comprising recording a change to any item of the bill of material made by any of the plurality of users, wherein the recording step includes recording a time of the modification and a name of one of the plurality of users that made the change.

11. A non-transitory computer readable medium having computer executable instructions for performing a method of supporting a product life cycle management (PLM) implementation comprising:
receiving in an enterprise resource planning (ERP) application an input seed file from a parts planning application (PPA), wherein the input seed file requests to interface with any one of a plurality of ERP attributes;
sending from the ERP application to the PPA an output attribute file when any one of the plurality of ERP attributes interfaces with the input seed file, and does not send the output attribute file when the input seed file does not interface, wherein the output attribute file includes the requested ERP attribute and further includes a set of characteristics of the one or more requested ERP attributes;
receiving in the PPA a set of bill of material data from a product data management (PDM) application, including a bill of material and a set of corresponding bill of material attributes for an assembly; and
integrating the output attribute file from the ERP application and the set of bill of material data from the PDM application in a single graphical user interface in the PPA, wherein a plurality of users have access to the configurable graphical user interface, and the access allows each of the plurality of users to edit the bill of material for the assembly in real time.

12. The computer readable medium of claim 11, further having computer executable instructions for configuring a specialized view of the integrated output attribute file and the bill of material, and saving the specialized view by any of the plurality of users.

13. The computer readable medium of claim 11, further having computer executable instructions for sending the input seed file request from the PPA and receiving the output attribute file containing the requested attribute characteristics in a PPA data storage.

14. The computer readable medium of claim 13, wherein the PPA data storage is a component of the PPA.

15. The computer readable medium of claim 13, wherein the PPA data storage is a separate content management system (CMS), further wherein the CMS is a web platform application or a document repository.

16. The computer readable medium of claim 11, wherein the PPA data storage is a database platform.

17. The computer readable medium of claim 11, further having computer executable instructions for recording a change to any item of the bill of material made by any of the plurality of users, wherein the recording includes recording a time of the modification and a name of one of the plurality of users that made the change.

18. The computer readable medium of claim 12, further having computer executable instructions for performing a computer-aided drafting application, the computer-aided drafting application providing the PDM application with the set of data including the bill of material and the set of corresponding bill of material attributes.

19. The computer readable medium of claim 11, further having computer executable instructions for receiving and processing the set of data including the bill of material and the set of corresponding bill of material attributes manually entered into the PDM.

20. The computer readable medium of claim 11, further having computer executable instructions for receiving and processing the set of data including the bill of material and the set of corresponding bill of material attributes in the PPA data storage from an input/output device.

21. In a computer system for supporting a product life cycle management (PLM) implementation having a graphical user interface including a display and a selection device, a method of managing a bill of material for an assembly with a plurality of users, comprising:
receiving at least one attribute from an enterprise resource planning (ERP) application, when an input seed file from a parts planning application (PPA) interfaces with any one of a plurality of ERP attributes, wherein the output attribute file is not sent when the input seed file does not interface;
receiving a set of bill of material data from a product data management (PDM) application, including a bill of material and a set of corresponding bill of material attributes for an assembly;
integrating the at least one attribute from the ERP and the set of bill of material data from the PDM application in the graphical user interface in the PPA;
configuring the integrated at least one attribute and the set of bill of material data in a plurality of specialized views;
saving any of the plurality of specialized views;
modifying the set of bill of material data, wherein a plurality of users have access to the plurality of specialized views, and the access allows each of the plurality of users to modify the bill of material of the assembly in real time; and
making a record when the set of bill of material data is modified.

22. The method of claim 21, further comprising a computer-aided drafting (CAD) application providing the PDM application with the set of data including the bill of material and the set of corresponding bill of material attributes.

23. The method of claim 21, further comprising receiving the set of data including the bill of material and the set of corresponding bill of material attributes in the PDM from an input/output device.

24. The method of claim 21, further comprising entering a second set of data including additions to the bill of material and the set of corresponding bill of material attributes.

* * * * *